(12) United States Patent
Louis et al.

(10) Patent No.: US 8,536,817 B2
(45) Date of Patent: Sep. 17, 2013

(54) SADDLE-SHAPED TRAJECTORY GENERATOR FOR TWO INTERSECTING PIPES

(75) Inventors: James Louis, Chicago, IL (US); Francis Xavier Hennessey, Arlington Heights, IL (US); Daniel Thomas Germata, Waukegan, IL (US)

(73) Assignee: Operations Technology Development, NFP, Des Plaines, IL (US)

( * ) Notice: Subject to any disclaimer, the term of this patent is extended or adjusted under 35 U.S.C. 154(b) by 336 days.

(21) Appl. No.: 12/963,652

(22) Filed: Dec. 9, 2010

(65) Prior Publication Data
US 2012/0150338 A1 Jun. 14, 2012

(51) Int. Cl.
*G05B 19/04* (2006.01)
*H01L 21/677* (2006.01)

(52) U.S. Cl.
CPC .............................. *H01L 21/67742* (2013.01)
USPC ............. 318/568.21; 318/568.12; 318/568.19

(58) Field of Classification Search
CPC ................................................ H01L 21/67742
USPC ........................... 318/568.21, 568.12–568.19
See application file for complete search history.

(56) References Cited

U.S. PATENT DOCUMENTS

| 4,862,373 | A | * | 8/1989 | Meng ............................. 701/423 |
| 5,530,791 | A | * | 6/1996 | Okabayashi ................... 700/255 |
| 7,979,158 | B2 | * | 7/2011 | Sladek et al. ................. 700/246 |

* cited by examiner

*Primary Examiner* — Bentsu Ro
*Assistant Examiner* — David Luo
(74) *Attorney, Agent, or Firm* — Pauley Petersen & Erickson

(57) ABSTRACT

An apparatus for generating a saddle-shaped trajectory for intersection of two cylindrical conduits. The apparatus includes an encoder module, a motorized axial module connected with the encoder module and movable only in a direction parallel to a longitudinal axis of an intersecting cylindrical conduit and a motorized rotatable module connected with the motorized axial module and rotatable around the longitudinal axis of the intersecting cylindrical conduit. Control software provided in one of the modules includes an algorithm providing control of the modules for generation of the saddle-shaped trajectory on the two cylindrical conduits. The algorithm requires input of only a radius of each of the cylindrical conduits.

10 Claims, 3 Drawing Sheets

SADDLE-SHAPED TRAJECTORY GENERATOR FOR TWO INTERSECTING PIPES

BACKGROUND OF THE INVENTION

1. Field of the Invention

This invention relates to a method and apparatus for generating the trajectory of a saddle-shaped curve resulting from the intersection of two cylindrical conduits. In one aspect, this invention relates to an automated apparatus for generating the trajectory of a saddle-shaped curve resulting from the intersection of two cylindrical conduits.

2. Description of Related Art

Automated pipe cutters, welders, adhesive dispensers and other automated apparatuses which follow a saddle-shaped curve resulting from the intersection of two cylindrical conduits, such as tubes and pipes, are either mounted onto the cylindrical conduit, in which case the apparatus rotates about the conduit, or have a conduit inserted, in which case the conduit is rotated. For those apparatuses having a 2-axis motion controller, the parameters that determine the shape or trajectory of the end effector, e.g. tool tip, cutting torch nozzle, adhesive dispenser nozzle, are sizes of the target pipe and the intersecting pipe, angle of intersection, and offset.

Current methods for measuring pipe diameters include calipers, pi tapes, linear CCD (charge-coupled device) arrays, and other time tested devices with varying degrees of accuracy. Manually entering the pipe diameter values into a motion controller or selecting from a complete list of existing motion control programs is both time consuming and provides opportunities for errors.

Current methods for following the saddle-shaped curve resulting from the intersection of two cylindrical conduits most commonly employ mechanical cams. The end effector is attached to a mechanism that physically rides on and follows the cam. However, a different and unique cam is required for each combination of target and intersecting conduit size and purchasing a collection of metal cams to accommodate all the possible combinations of conduits is cost prohibitive for many companies.

Other methods involve modeling the intersecting conduits in a 3D CAD (computer assisted design) program, then transferring the model to CAM (computer assisted manufacturing) software which generates code used by CNC (computer numerical control) machines to follow the trajectory. However, a complete CAD/CAM/CNC system is too complex to own and they operate if one only wishes to process the saddle-shaped curve unique to intersecting cylindrical conduits.

Accordingly, there is a need for a method and apparatus for generating saddle-shaped trajectories resulting from the intersection of two cylindrical conduits which avoids the complexities of a CAD/CAM/CNC system, which does not require the use of mechanical cams, and which reduces the amount of time and opportunities for errors associated with manual methods.

SUMMARY OF THE INVENTION

It is, thus, one object of this invention to provide an apparatus for generating saddle-shaped trajectories resulting from the intersection of two cylindrical conduits without using mechanical cams.

It is one object of this invention to provide and apparatus for generating saddle-shaped trajectories resulting from the intersection of two cylindrical conduits, i.e. a target conduit and an intersecting conduit, without using a CAD/CAM/CNC system.

These and other objects of this invention are addressed by an apparatus comprising an encoder module, a motorized axial module connected with the encoder module and movable only in a direction parallel to a longitudinal axis of the intersecting cylindrical conduit, a motorized rotatable module connected with the motorized axial module and rotatable around the longitudinal axis of the intersecting cylindrical conduit, and control software contained within one of the modules. The control software requires an input of only a radius of each of the cylindrical conduits to control the modules for generation of the saddle-shaped trajectory on the two cylindrical conduits. Connected with an end of the encoder module proximate the intersecting cylindrical conduit is an end effector for performance of a particular function or process on the target pipe joint. When the end effector is lowered onto the target cylindrical conduit in preparation for performance of the particular function or process, a feedback device, preferably integral with the encoder module, measures the pipe radius (FIG. 1) from a zero point at the pipe centerline. This value is then applied either to a parametric equation or to a program range in the motion controller. Possible combinations of target and intersecting pipe sizes that do not include the target pipe size are not available.

BRIEF DESCRIPTION OF THE DRAWINGS

These and other objects and features of this invention will be better understood from the following detailed description taken in conjunction with the drawings, wherein.

DETAILED DESCRIPTION OF THE PRESENTLY PREFERRED EMBODIMENTS

The invention disclosed herein is an apparatus comprising at least a 2-axis motion controller for producing and processing the saddle-shaped joint formed by two intersecting cylindrical conduits, such as tubes and pipes, one of which is a target cylindrical conduit and the other of which is an intersecting cylindrical conduit. The apparatus comprises automated trajectory generation means for generating a saddle-shaped trajectory on each of the cylindrical conduits without the use of either a mechanical cam or a CAD/CAM/CNC system. The automated trajectory generation means comprises a first module having an end effector for creating the saddle-shaped trajectory on the cylindrical conduits, which module may be adapted to determine the radius of the cylindrical conduits. The automated trajectory generation means further comprises a motorized second module adapted to motivate the end effector in a longitudinal direction of the intersecting cylindrical conduit and a motorized third module adapted to motivate the end effector around the intersecting cylindrical conduit perpendicular to the longitudinal direction of the motorized second module. The automated trajectory generation means further comprises control software contained in one of the modules, which control software comprises an algorithm providing control of the modules for generation of the saddle-shaped trajectory on the two cylindrical conduits. Operation of the algorithm requires the input only of the radius of each of the cylindrical conduits.

Figure 1:
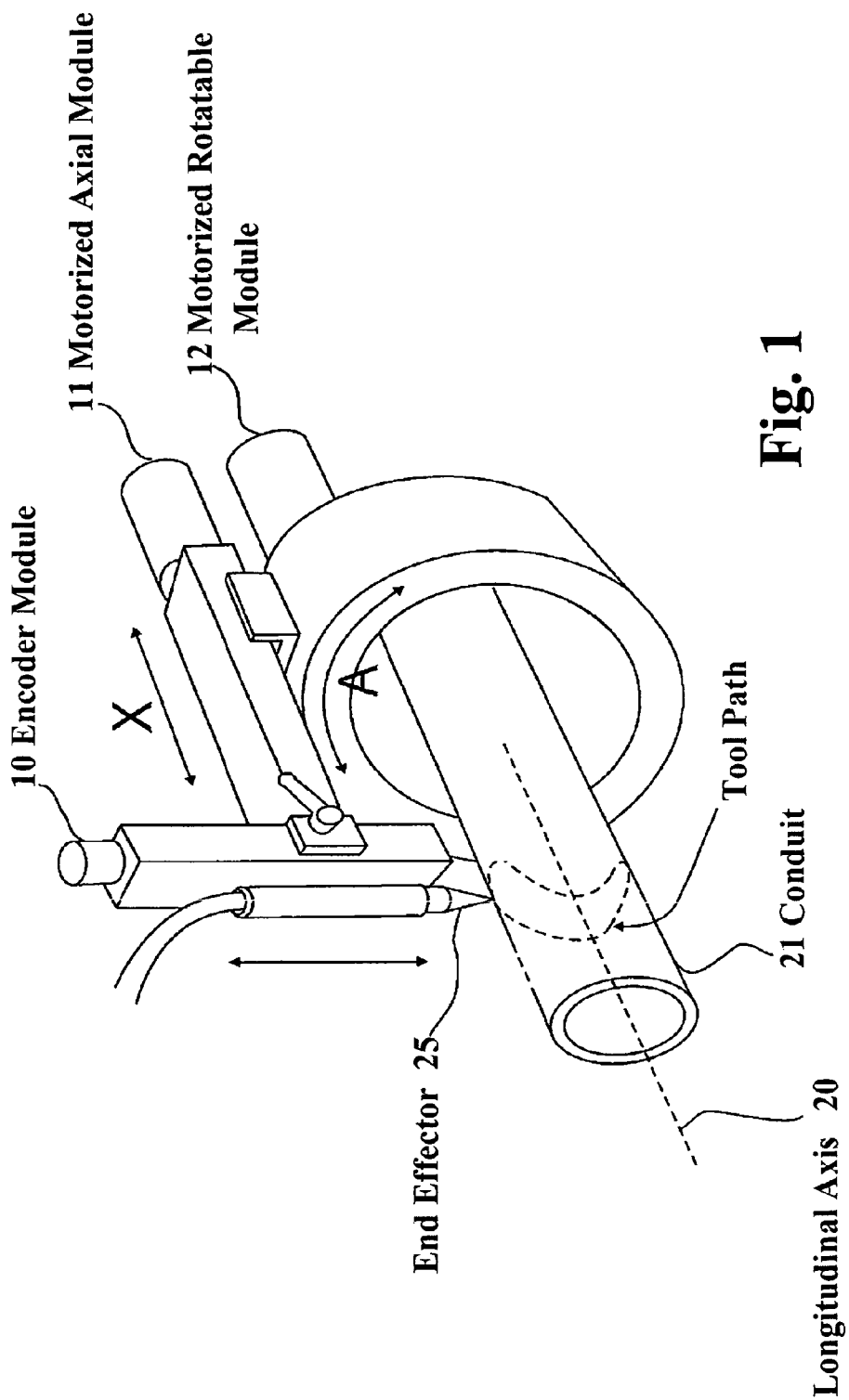
FIG. 1 is a diagram showing the principles of automatic trajectory selection using an apparatus of this invention.
Figure 2:
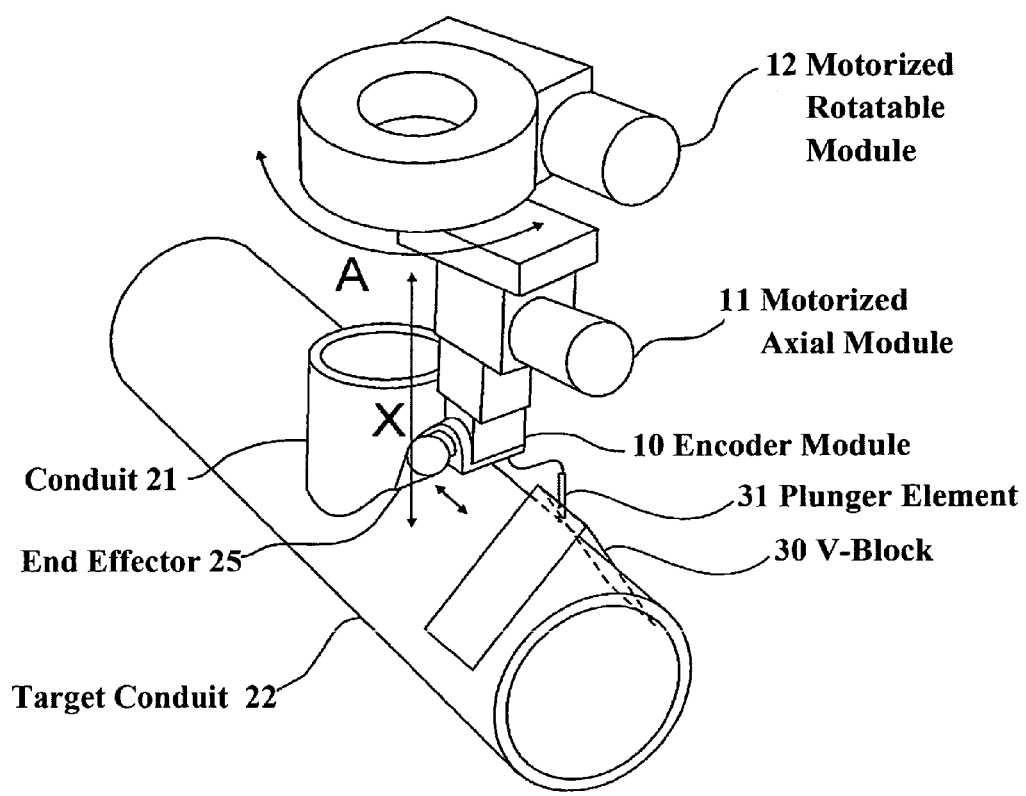
FIG. 2 is a diagram of an apparatus for generating saddle-shaped trajectories resulting from the intersection of two cylindrical conduits in accordance with one embodiment of this invention.

The apparatus in accordance with one embodiment of this invention as shown in FIGS. 1 and 2 comprises encoder module 10 movable independently of other components in a direction perpendicular to a plane encompassing a longitudinal axis of a intersecting cylindrical conduit 21 for the purpose of determining the radius of the intersecting cylindrical conduit, motorized axial module 11 movable only in a direction perpendicular to a plane encompassing a longitudinal axis of the intersecting cylindrical conduit 21, i.e. linear axis X, and motorized rotatable module 12 which is rotatable around the longitudinal axis or centerline 20 of the intersecting cylindrical conduit 21, i.e. rotatable axis A. As used herein, the "intersecting" cylindrical conduit is the conduit having the longitudinal axis or centerline around which motorized rotatable module 12 is rotatable. In the context of an underground utility pipeline, the intersecting cylindrical conduit corresponds to the riser pipe connected with the underground utility (main) pipeline, i.e. target pipe. Disposed at the end of the encoder module proximate the pipe is an end effector 25, which varies depending upon the application of the apparatus.

The end effector is a tool head suitable for processing the joint of the intersecting cylindrical conduit. In accordance with one embodiment of this invention, the tool head, such as a welding tip, for welding the joint of the intersecting cylindrical conduits. In accordance with another embodiment of this invention, the tool head comprises adhesive means for adhesively joining the two intersecting cylindrical conduits, such as a nozzle for delivering an adhesive to the area of the joint. In accordance with another embodiment of this invention, the tool head comprises cutting means for cutting the saddle-shaped trajectory in the cylindrical conduits. Such cutting means include, but are not limited to, plasma (electrical) or oxy-acetylene (gas) torches.

The apparatus of this invention comprises at least a 2-axis motion controller and is able to generate a saddle-shaped trajectory resulting from the intersection of two pipes, tubes, or other cylindrical conduits merely by inputting only the radius of each of the intersecting conduits.

The operation of the apparatus requires that the motion of the rotary axis A from 0 to 360 degrees be coordinated with the motion of the linear axis X. This coordination is accomplished using the following parametric equation:

$$X = R_1 - \sqrt{R_1^2 - (R_2 \sin\phi)^2}$$

where $R_1$ is the radius of the target conduit 22 and $R_2$ is the radius of the intersecting conduit 21. The depth or X axis becomes a function of the A axis ($\phi$) angle as it rotates about the centerline of the intersecting conduit. An incorrect entry of this value into a 2-axis or greater motion controller can result in a crash. Any mechanism which enables coordinated movement of the motorized modules in accordance with the control software may be used for connecting of the modules to each other. Such mechanisms are well known to those skilled in the art.

The apparatus of this invention is controlled by a software program situated in one of the modules, preferably the encoder module. The software program comprises an algorithm in the form of the above equation, which controls the movement of the motorized modules, based upon input only of the radius of each of the target pipe or conduit and the intersecting pipe or conduit. It will be appreciated that the accuracy of the measurements of the pipe radii by the encoder module, as well as the accuracy of the datum (or machine zero) point location, will determine the closeness with which the trajectory follows the actual pipe joint. One example of the program for use in a welder in accordance with one embodiment of this invention is set forth as an appendix. The program is written in G-Code and comprises only two variables—target pipe diameter and riser (intersecting) pipe diameter. The algorithm can be seen expressed in the longest line of code.

The encoder module (rotary or linear) 10, which provides a pulse stream to the motion controller, measures the intersecting pipe diameter, either mechanically, such as a scale disposed on the outer surface of the module, or electronically, when the end effector 25 is touching the surface of the pipe. This directly measured value can then be used as a parameter in a parametric equation, or to restrict the program selection to only the matching intersecting pipe diameter trajectories. The possible end effector paths are then only determined by the target pipe diameter. This simplifies the choices available to the operator of the apparatus and reduces the chance of a crash due to incorrect data entry.

Figure 3:
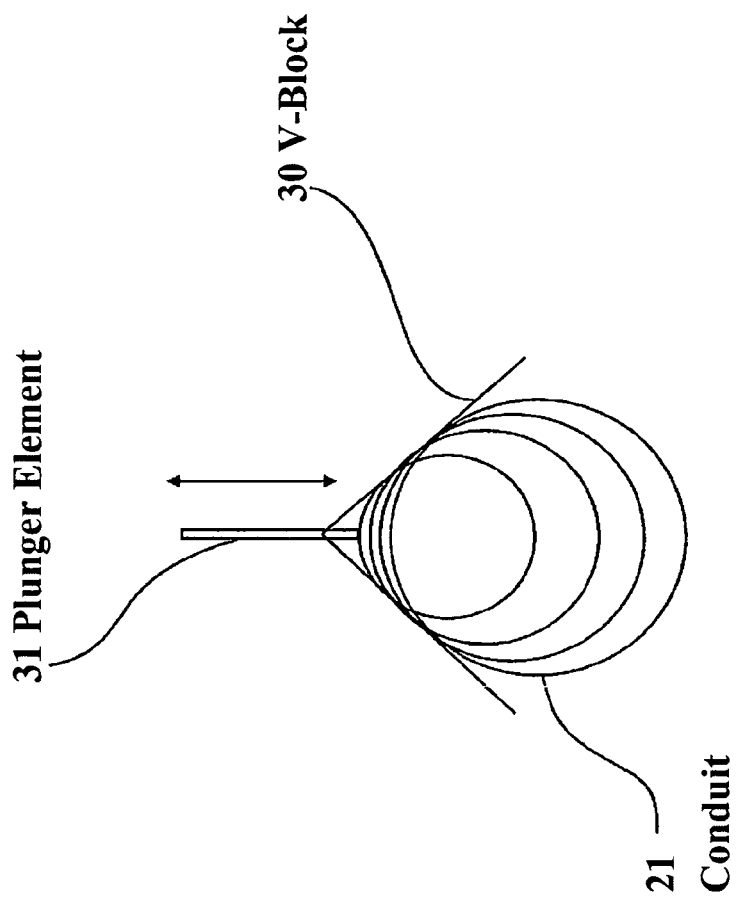
FIG. 3 is a diagram showing the use of a V-block for determining the radius of a cylindrical conduit in accordance with one embodiment of this invention.

In accordance with one embodiment of this invention as shown in FIG. 2, the radius of the target conduit 22 is determined using a V-block 30 having a plunger element 31. Determination of the radius of the target conduit is based upon the distance traveled by the plunger element 31 as the V-block is lowered onto the conduit. As shown in FIG. 3, as the radius of the conduit 21 decreases, the distance traveled by the plunger element 31 increases. Depending upon the angle at the apex of the V-block, simple geometry can be used to determine the radius of the conduit. For the purpose of simplicity, in accordance with one preferred embodiment of this invention, the angle at the apex of the V-block is 90°.

While in the foregoing specification this invention has been described in relation to certain preferred embodiments thereof, and many details have been set forth for the purpose of illustration, it will be apparent to those skilled in the art that the invention is susceptible to additional embodiments and that certain of the details described herein can be varied considerably without departing from the basic principles of this invention.

---

G-Code running Welder (25 lines)

```
%
(EMC2 PicoWelder09)
G17 G20 G40 G49
G54 G80 G90 G94
#<_TargetPipeDia> =8.0000
#<_TargetPipeRadius> = [#<_TargetPipeDia>/2]
#<_RiserPipeDia> =7.0000
#<_RiserPipeRadius> =[#<_RiserPipeDia>/2]
#<_ADegreeTotal> =361.00
#<_ADegreeCounter> =0
```

-continued

G-Code running Welder (25 lines)

```
G90 G0 Y#<RiserPipeRadius>
G04 P.1
G64
O0100 D0
#<_ADegreeCounter> =[#<_ADegreeCounter> +1]
G90 G1
A[#<_ADegreeCounter>]X[SQRT[#<_TargetPipeRadius>**-[#<_RiserPipeRadius>*SIN[#<_ADegreeCounter>]]**2]-#<_TargetPipeRadius>] F50.
O0100 WHILE[[#<_ADegreeCounter> LT #<_ADegreeTotal>]
G04 P.1
G90 G0 X0.
G04 P.1
G0 A0.
G04 P.1
G0 Y0
M30 (end program)
%
```

What is claimed is:

1. An apparatus for generating a saddle-shaped trajectory for intersection of two cylindrical conduits comprising:
an encoder module;
a motorized axial module connected with said encoder module and movable only in a direction parallel to a longitudinal axis of an intersecting cylindrical conduit;
a motorized rotatable module connected with said motorized axial module and rotatable around said longitudinal axis of said intersecting cylindrical conduit; and
control software contained in one of said modules, said control software comprising an algorithm providing control of said modules for generation of said saddle-shaped trajectory on said to two cylindrical conduits, said algorithm requiring input of only a radius of each of said cylindrical conduits.

2. The apparatus of claim 1, wherein said encoder module comprises measurement means for measuring a radius of each of said cylindrical conduits.

3. The apparatus of claim 2, wherein said measurement means comprises electronic means for measuring and storing a distance traveled by said encoder module.

4. The apparatus of claim 1, wherein said encoder module comprises cutting means for cutting a saddle-shaped profile in said cylindrical conduits.

5. The apparatus of claim 1, wherein said encoder module comprises welding means for welding intersecting said cylindrical conduits having a saddle-shaped profile together.

6. The apparatus of claim 1, wherein said encoder means comprises adhesive means for applying an adhesive along said saddle-shaped trajectory of said cylindrical conduits.

7. An apparatus for processing a joint of two intersecting cylindrical conduits comprising:
automated trajectory generation means for generating a saddle-shaped trajectory on each of said cylindrical conduits without the use of a mechanical cam and without the use of a CAD/CAM/CNC system, wherein said automated it trajectory generation means comprises a first module having an end effector for creating said saddle-shaped trajectory on said cylindrical conduits and adapted to determine a radius of said cylindrical conduits, a motorized second module adapted to motivate said end effector in a longitudinal direction of one of said cylindrical conduits, and a motorized third module adapted to motivate said end effector around said said one of said cylindrical conduits perpendicular to said longitudinal direction of said motorized second module.

8. The apparatus of claim 7, wherein said automated trajectory generation means further comprises control software contained in one of said modules, said control software comprising an algorithm providing control of said modules for generation of said saddle-shaped trajectory on said two cylindrical conduits, said algorithm requiring input of only a radius of each of said cylindrical conduits.

9. The apparatus of claim 7, wherein said end effector is a tool head selected from the group consisting of a welding means for welding said joint of said intersecting cylindrical conduits, adhesive means for adhesively joining said two intersecting cylindrical conduits, and cutting means for cutting said saddle-shaped trajectory in said cylindrical conduits.

10. The apparatus of claim 7, wherein said first module is connected with a V-block device for determining said radius of said cylindrical conduits.

* * * * *